United States Patent
Lu et al.

(10) Patent No.: US 6,777,256 B2
(45) Date of Patent: Aug. 17, 2004

(54) METHOD FOR FORMING A NON-PHOTOSENSITIVE PIXEL-DEFINING LAYER ON A OLED PANEL

(75) Inventors: Tien-Rong Lu, Tainan (TW); Yih Chang, Chung-Ho (TW)

(73) Assignee: Ritdisplay Corporation, Hsin Chu Industrial Park (TW)

( * ) Notice: Subject to any disclaimer, the term of this patent is extended or adjusted under 35 U.S.C. 154(b) by 0 days.

(21) Appl. No.: 10/391,606

(22) Filed: Mar. 20, 2003

(65) Prior Publication Data

US 2003/0157740 A1 Aug. 21, 2003

Related U.S. Application Data

(62) Division of application No. 09/791,556, filed on Feb. 26, 2001, now Pat. No. 6,559,604.

(30) Foreign Application Priority Data

Apr. 26, 2000 (TW) .......................................... 89107925 A

(51) Int. Cl.[7] .............................................. H01L 21/00
(52) U.S. Cl. ........................... 438/30; 430/319; 430/321
(58) Field of Search ............................ 438/30; 430/319, 430/321

(56) References Cited

U.S. PATENT DOCUMENTS

| | | | |
|---|---|---|---|
| 5,701,055 A | * | 12/1997 | Nagayama et al. ......... 313/504 |
| 5,962,970 A | * | 10/1999 | Yokoi et al. ................ 313/506 |
| 6,369,495 B2 | * | 4/2002 | Codama et al. ............ 313/292 |
| 6,582,888 B1 | * | 6/2003 | Herbst et al. ............... 430/312 |
| 2002/0162998 A1 | * | 11/2002 | Okuda et al. ................ 257/59 |
| 2003/0030369 A1 | * | 2/2003 | Shih et al. .................. 313/504 |

* cited by examiner

Primary Examiner—Alexander Ghyka
(74) Attorney, Agent, or Firm—Bacon & Thomas

(57) ABSTRACT

A method for forming a pixel-defining layer on an OLED panel comprises the following steps: (A) providing a substrate; (B) forming a plurality of first electrodes in parallel stripes on the substrate; (C) coating a layer of non-photosensitive polyimide or polyimide precursor compositions on the substrate; (D) first prebaking said substrate; (E) coating a layer of photoresist compositions on the layer of non-photosensitive polyimide or polyimide precursor compositions; (F) second prebaking the substrate; (G) forming patterns of the photoresist by exposing the substrate to masked radiaion and developing the photoresist; (H) etching the layer of said non-photosensitive polyimide or polyimide precursor compositions to form patterned polyimide or polyimide precursor compositions; (I) releasing or stripping the patterned layer of the photoresist compositions; and (J) baking the substrate with patterned non-photosensitive polyimide or polyimide precursor compositions to form the pixel-defining layer.

12 Claims, 1 Drawing Sheet

US 6,777,256 B2

METHOD FOR FORMING A NON-PHOTOSENSITIVE PIXEL-DEFINING LAYER ON A OLED PANEL

This application is a divisional application of U.S. application Ser. No. 09/791,556, filed Feb. 26, 2001 now U.S. Pat. No. 6,559,604 (of which the entire disclosure of the pending, prior application is hereby incorporated by reference), which has been allowed and the Issue Fee paid.

BACKGROUND OF THE INVENTION

1. Field of the Invention

The present invention relates to a surface treatment process on an OLED panel and, more particularly, to a method for fabricating an OLED panel.

2. Description of Related Art

The OLED panels are popular because of their advantages such as light weight, high contrast of display, fast response rate, low power consumption and high brightness. Although many advantages can be found in the OLED display panels, many technical problems in manufacturing OLED display panels need to be overcome.

So far, the fabrication of OLED display panels is achieved by subsequently forming anode in parallel stripes, parallel photoresist ramparts, organic electroluminescent media and cathodes on the substrate of panels. The parallel photoresist ramparts act as shadow masks as organic electroluminescent media and cathode materials are deposited on the exposed parallel anodes between photoresist ramparts. However, the lifetime of the OLED displays made by these processes is not long. The stability of the OLED displays and the yields of these manufacturing processes are poor. The short lifetime and the poor stability of the OLED display panels is the result of direct contact between anodes and cathode materials in areas close to the border of pixels or the area close to the bottom of the sidewalls of photoresist ramparts. Since the border of the pixels are only roughly defined or separated by the photoresist ramparts and the anodes on the substrate, the contact between anodes and cathode materials cannot be effectively prevented. Therefore, the OLED display panels need an effective method to prevent the occurrence of electrical shorts between anodes and cathodes.

Recently, it has been suggested to deposit or coat $SiO_2$ insulation layers or photoresists on the surface of the substrate to prevent possible electrical shorts. However, the process for fabricating $SiO_2$ insulation layers on the substrate around the pixel areas is complicated and costly. The process for fabricating $SiO_2$ insulation layers on the OLED display panels is difficult in the mass-production of OLED display panels. On the other hand, since the insulation layer made by photoresist around pixels' areas keep releasing organic solvent or water vapor from the photoresist slowly, the photoresist insulation layers become major sources of vapors which deteriorate the quality of the sensitive organic electroluminescent media on the OLED display panel. Therefore, the photoresist insulation layers also are the major factor that cause short lifetime and poor display quality. Moreover, the photoresists contain many photosensitive chemicals which decrease the photochemical stability of the photoresist insulation layers under high emission and shorten the lifetime of the OLED display panels. Therefore, the photoresist insulation layer is not a right answer to solve the problem illustrated above. Therefore, a method for fabricating a pixel-defining layer on the OLED panel to provide high yield of manufacturing, good stability of pixel-defining layers for preventing electrical shorts and to extend the lifetime of pixels or OLED display panels would be desirable.

Therefore, it is desirable to provide an improved method to mitigate the aforementioned problems.

SUMMARY OF THE INVENTION

The object of the present invention is to provide a method for fabricating a pixel-defining layer on an OLED panel to clearly define the area of the pixels on said OLED panel and to separate cathodes from anodes for avoiding shorts.

Another object of the present invention is to provide a method for fabricating a pixel-defining layer on an OLED panel to increase the stability of the pixel-defining layer for electricity, heat and light, and extend the lifetime of said OLED panel Another object of the present invention is to provide a method for fabricating a pixel-defining layer to produce a non-photosensitive polyimide pixel-defining layer stably and increase the yield.

To achieve the above objects, the method for forming a pixel-defining layer on an OLED panel of the present invention includes:

(A) providing a substrate;
(B) forming a plurality of first electrodes in parallel stripes on said substrate;
(C) coating a layer of non-photosensitive polyimide or polyimide precursor compositions on said substrate with said first electrodes;
(D) first prebaking said substrate with said layer of said non-photosensitive polyimide or polyimide precursor compositions;
(E) coating a layer of photoresist compositions on said layer of said non-photosensitive polyimide or polyimide precursor compositions;
(F) second prebaking said substrate with said layer of said photoresist compositions;
(G) forming patterns of said photoresist by exposing said substrate to masked radiaion and developing said photoresist on said substrate;
(H) etching said layer of said non-photosensitive polyimide or polyimide precursor compositions to form a patterned layer of said non-photosensitive polyimide or polyimide precursor compositions;
(I) releasing or stripping said patterned layer of said photoresist compositions; and
(J) baking said substrate with patterned non-photosensitive polyimide or polyimide precursor compositions for crosslinking or curing said patterned non-photosensitive polyimide or polyimide precursor compositions to form said pixel-defining layer.

The method for forming a pixel-defining layer on an OLED panel of the present invention may optionally further include: (K) forming a plurality of photoresist ramparts on said substrate and selectively on said first electrodes or said stripes of said polyimide pixel-defining layer; wherein said photoresist ramparts protrude from said substrate and the top sections of said ramparts are about parallel to the surface of said substrate.

The method for forming a pixel-defining layer on an OLED panel of the present invention may optionally further include: (L) depositing organic electroluminescent media to the exposed area between said ramparts on said substrate or said first electrodes; and (M) forming a plurality of second electrodes on said organic electroluminescent media, on said substrate or said first electrodes.

The method for forming a pixel-defining layer on an OLED panel of the present invention can selectively further comprise forming a plurality of auxiliary electrodes on or beneath the surface of said substrate before forming a plurality of said first electrodes on said substrate.

The method for forming a pixel-defining layer on an OLED panel of the present invention can selectively further comprise forming parallel photoresist ramparts having T-shape cross-section on said non-photosensitive polyimide pixel-defining layer, and said patterns of said photoresist are parallel stripes.

The OLED panel of the present invention comprises: a substrate; a plurality of first electrodes in parallel stripes, said first electrodes being located on the surface of said substrate; a plurality of non-photosensitive polyimide pixel-defining layers, said non-photosenstive polyimide pixel-defining layers being selectively located on said substrate or on said first electrodes; a plurality of photoresist ramparts, said photoresist ramparts being selectively located on said first electrodes or on said pixel-defining layer; a plurality of organic electroluminescent media, said organic electroluminescent media being located in the exposed area between said ramparts on said substrate; and a plurality of second electrodes, said second electrodes being located on said organic electroluminescent media; wherein each said ramparts protruding from said substrate have an overhanging portion projected in a direction parallel to said substrate; and said photoresist ramparts are formed through coating a photoresist composition onto said substrate, exposing said substrate to masked radiation and development.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
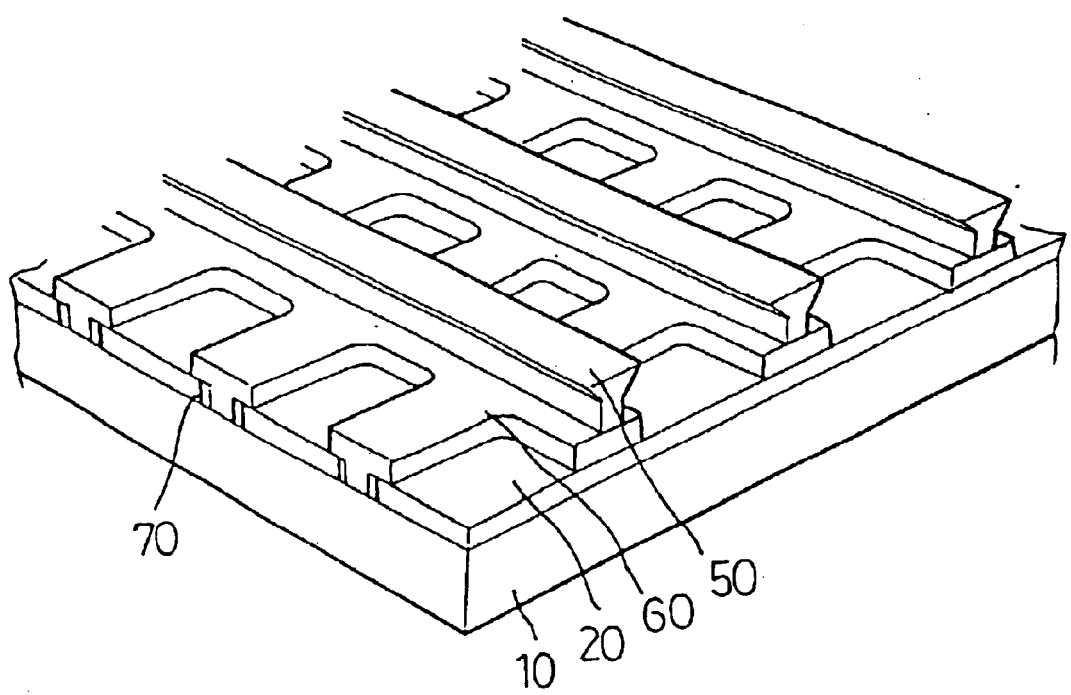
FIG. 1 is a partially enlarged perspective view of the panel of the present invention before formation of organic electroluminescent medium and cathodes (second electrodes)

The method of the invention for forming a pixel-defining layer on an OLED panel, comprises following steps: (A) providing a substrate; (B) forming a plurality of first electrodes in parallel stripes on said substrate; (C) coating a layer of non-photosensitive polyimide or polyimide precursor compositions on said substrate with said first electrodes; (D) first prebaking said substrate with said layer of said non-photosensitive polyimide or polyimide precursor compositions; (E) coating a layer of photoresist compositions on said layer of non-photosensitive polyimide or polyimide precursor compositions; (F) second prebaking said substrate with said layer of said photoresist compositions; (G) forming patterns of said photoresist by exposing said substrate to masked radiaion and developing said photoresist on said substrate; (H) etching said layer of said non-photosensitive polyimide or polyimide precursor compositions to form patterned layer of said non-photosensitive polyimide or polyimide precursor compositions; (I) releasing or stripping said patterned layer of said photoresist compositions; and (J) baking said substrate with patterned non-photosensitive polyimide or polyimide precursor compositions for crosslinking or curing said patterned non-photosensitive polyimide or polyimide precursor compositions to form said pixel-defining layer.

Since polyimides have better thermal, electrical, mechanical and photochemical stability than other conventional polymers for insulation, polyimides are good candidates for pixel-defining layers. On the other hand, the cured polyimides hardly release organic solvent to deteriorate the sensitive organic electroluminescent media of OLED panels. This advantage can extend the lifetime of the OLED panel. Moreover, the polyimide pixel-defining layers on the OLED panels of the present invention can separate the ITO anodes and the cathodes effectively from electrical shorts. By clearly defining the pixel area and fully separating the anodes and the cathode materials, the polyimide pixel-defining layers can decrease the possibility of shorts between anodes and the cathode materials, especially the cathode materials deposited close to the bottom of the sidewalls of the photoresist ramparts, on the OLED panels. Therefore, the yield of producing OLED panels can increase significantly. Furthermore, since only one exposure step and one development step is required for forming polyimide pixel-defining layers, the procedure is much simpler than the conventional process for forming insulation layers (either photoresist insulation layer or $SiO_2$ insulation layer) between anodes and cathodes on the OLED panels.

The substrate utilized in the process of the present invention can be transparent or non-transparent. Preferably, the substrates used in the present invention are sodalime glasses, boron silica glasses, plastics or silicon wafers. The anode suitable for the present invention can be any conventional material for electrical conductance. Preferably, the first electrode (anode) of the present invention can be $InSnO_3$, $SnO_2$, $In_2O_3$ doped with ZnO, CdSnO or antimony. The second electrode (cathode) suitable for the present invention can be any conventional material for electrical conductance. Preferably, the second electrode (cathode) of the present invention can be MgAg, Al, BaAl, diamonds, like-diamonds or Ca.

For the method for forming a pixel-defining layer of the present invention, a plurality of parallel auxiliary electrodes can be selectively formed on the substrate before the anodes are formed to provide better electrical conductance for the first electrodes (anodes). In most cases, the parallel auxiliary electrodes are formed through lithography on the substrate. The materials of the auxiliary electrodes are not limited. Any conventional electrically conductive materials can be used. Preferably, the auxiliary electrode is Cr, Al, Cu, Ag or gold. The non-photosensitive polyimide can be coated on the substrate using any conventional method. Preferably, the non-photosensitive polyimide or polyimide precursor compositions is coated using spin-coating of 1000 to 3000 rpm on the substrate. The substrate coated with non-photosensitive polyimides or polyimide precursor compositions is first prebaked at a temperature to drive out the solvent inside the non-photosensitive polyimides or polyimide precursor compositions. Preferably, the coated substrate is first prebaked at a temperature ranging from 120 to 160° C. The prebaked non-photosensitive polyimide or polyimide precursor compositions is then coated with a layer of photoresist. Preferably, the photoresist is a positive photoresist. The photoresist can be coated on the substrate by using any conventional method. Preferably, the photoresist is coated using spin-coating of 1000 to 3000 rpm on the substrate. The substrate coated with photoresist is second prebaked at a temperature to drive out the solvent inside the photoresist. Preferably, the coated substrate is second prebaked at a temperature ranging from 90 to 110° C. The substrate coated both photoresist and non-sensitive photosensitive polyimide or polyimide precursor compositions can be exposed to masked radiation and developed to form patterns. The development of the photoresist can be achieved by any conventional method and chemical. Preferably, the photoresist is developed by 2.38% of TMAH (tetramethyl ammonium hydroxide). The pattern of the photoresist is not limited. Preferably, the pattern of the photoresist is parallel stripes intersecting anodes perpendicularly or a stripe net with selective open portion areas on the first electrodes (anodes) on the substrate. The non-photosensitive polyimide or polyimide precursor compositions is then etched to form a pattern which is the same as that of the photoresist. The formation of the pattern of non-photosensitive polyimide or polyimide precursor compositions can be achieved by any conventional etching method or etching chemical. Preferably, the non-photosensitive polyimide or polyimide precursor compositions is etched by 2.38% of TMAH (tetramethyl ammonium hydroxide). The patterned photoresist is then released or stripped after the patterned non-photosensitive polyimide or polyimide precursor compositions is etched. Preferably, the photoresist is released or stripped by isopropanol, PGMEA or n-butyl acetate. The patterned non-photosensitive polyimide or polyimide precursor compositions can be baked at a temperature so that the non-photosensitive polyimides or polyimide precursor compositions can crosslink or cure to form a pixel-defining layer. Preferably, the baking temperature is at least higher than 200° C. Most preferably, the baking temperature is at a temperature higher than 350° C. The non-photosensitive polyimides or polyimide precursor compositions applied in the method of the present invention can be any conventional non-photosensitive polyimides or polyimide precursor compositions. Preferably, the non-photosensitive polyimides or polyimide precursor compositions contains polyamic acids reacted from amines such as ODAs (oxydianiline) and anhydrides such as PMDAs (pyromellitic dianhydride) or polyamic acid reacted from photosensitive amines such as ODA (oxydianiline) and anhydrides such as BTDAs (benzophenone tetracarboxylic dianhydride) or PMDAs (pyromellitic dianhydride).

After the pixel-defining layers form, the process for forming organic electroluminescent media and the cathodes of the OLED panels can be achieved subsequently. A plurality of photoresist ramparts form on the substrate with photosensitive polyimide pixel-defining layer through photolithography. The patterns of the photoresist ramparts are not limited. Preferably, the photoresist ramparts are parallel ramparts and have a T-shaped cross-section. The photoresist ramparts selectively intersect with the anodes and the pixel defining layers. Preferably, the photoresist ramparts selectively intersect with the anodes perpendicularly. The photoresist can be any conventional photoresist. Preferably, the photoresist ramparts are made of positive photoresist. Most preferably, the photoresist ramparts on the panel of the OLEDs are made of positive chemically amplified photoresist compositions that contain photo-acid generators. The ramparts on the substrate of the panels of OLEDs act as ideal shadow masks for subsequent deposition processes and also serves as isolating walls to separate side-deposited cathode materials from anodes.

Organic electroluminescent media are formed after a plurality of first electrodes (anodes) and ramparts are formed. The organic electroluminescent media are deposited on the substrate and selectively on anodes. The organic electroluminescent media are deposited as a single layer or optionally multiple layers (e.g. Hole transporting layers, Emitting layers, Electron transporting layers) on the substrate and selectively on anodes. A plurality of cathodes (second electrodes) then form on the organic electroluminescent media on the substrate. The formation of cathodes (second electrodes) can be achieved through conventional deposition methods. The organic electroluminescent media is sandwiched by cathodes (second electrodes) and the anodes (first electrodes) on the substrate. The open portions where anodes (first electrodes) and cathodes (second electrodes) are located between ramparts are the emitting portions (i.e. pixels) of OLED. The projections of the first electrodes on the substrate intersect those of the second electrodes. Preferably, the projections of the first electrodes (anodes) are perpendicular to the projections of the second electrodes.

FIG. 1 is a partially enlarged perspective view of the panel of the present invention before formation of organic electroluminescent medium and cathodes (second electrodes). A plurality of auxiliary electrodes 70 is formed on the substrate 10 in parallel stripes through photolithography. Then a plurality of anodes (first electrodes) 20 is formed in parallel stripes on the substrate 10. The anodes (first electrodes) 20 are almost in the same height and each first electrode cover two auxiliary electrodes 70. A pixel-defining layer 60 in a pattern of multiple pixel windows is formed on the substrate 10 and subsequently on the first electrodes 20. The open windows of the pixel-defining layer 60 locate above part of the anodes (first electrodes) 20. Each stripe of f anodes (first electrodes) 20 is separated into several open areas by the pixel-defining layer 60.

The formation of pixel-defining layer 60 is achieved by first spin coating a composition of non-photosensitive polyimide precursors on the substrate where the auxiliary electrodes and anodes (first electrodes) 20 are located. The coated substrate is first prebaked to drive out the solvent inside the non-photosensitive polyimide composition. Then a layer of positive photoresist is coated on the non-photosensitive polyimide. A patterned photoresist and a non-photosensitive polyimide composition layer with identical patterns further forms through photolithography. The patterned photoresist is then released. The non-photosensitive polyimide composition layer is further cured and crosslinked to form a pixel-defining layer on the substrate.

A plurality of ramparts 50 which protrude on the substrate 10 and have a T-shaped cross-section is formed on the pixel-defining layer 60 and the substrate 10. The ramparts 50 have an overhanging portion projecting in a direction parallel to the substrate 10. The ramparts 50 are in a pattern of parallel strides and cross over the first electrodes 20 perpendicularly. The open portions between ramparts 50 are above the open window areas of pixel-defining layer 60. The open window areas of pixel-defining layer 60 are the locations of future pixels after subsequent organic electroluminescent media 30 and second electrodes 40 form.

The OLED panels made through the methods illustrated above can be further processed to selectively form an antireflection on the panel or may be sealed by a cover. The color of the pixels of the OLED panels obtained through the methods of the present invention can be any conventional color such as red, green or blue. The color of the pixels of the OLED panels can be controlled by the organic electroluminescent media. The OLED panels of the present invention can be either panels with single color, multiple colors or full colors.

The OLEDs achieved through the method of the present invention can be applied to any display of images, graphs, symbols, letters and characters for any apparatus. Preferably, the OLEDs of the present invention are applied to the display of televisions, computers, printers, screens, vehicles, signal machines, communication devices, telephones, lights, electric books, microdisplays, fishing machines, personal digital assistants (PDA), game machines, game goggles and airplanes.

More detailed examples are used to illustrate the present invention, and these examples are used to explain the present invention. The examples below, which are given simply by way of illustration, must not be taken to limit the scope of the invention.

EXAMPLE 1

A panel of an OLED was fabricated through the surface treatment process of the present invention.

A clean glass substrate coated with a layer of Cr and a layer of ITO was applied here. The auxiliary Cr electrodes in parallel stripes were formed through photolithography. After the substrate with auxiliary Cr electrodes was fully cleaned, ITO anodes were formed in a pattern of stripes on the cleaned glass substrate. Each ITO stripe was coordinated with two auxiliary electrodes on the surface of the ITO stripe. Then the substrate was spin-coated with a solution of non-photosensitive polyimide composition at a spin rate ranging from 1000 to 3000 rpm. The coated substrate was first prebaked in an oven at a temperature ranging from 120° C. to 160° C. The substrate was spin coated with another solution of positive photoresist at a spin rate ranging from 2000 to 4000 rpm. The substrate coated with positive photoresist and non-sensitive polyimide was then second prebaked at a temperature ranging from 90 to 110° C. A mask with a pattern having rectangular open portions is applied as the coated photoresist was exposed to radiation (deep UV). The coated substrate was then post-baked (PEB) and developed at the same time. The development was fininshed by spraying 2.38% of tetramethyl ammonium hydroxide solution on the exposed substrate to form a layer of photoresist having a pattern with rectangular open portions. The non-sensitive polyimide was then etched by a solution of 2.38% of tetramethyl ammonium hydroxide to form a layer of polyimide with a pattern as same as that of the photoresist. The photoresist layer was then released by isopropanol, PGMEA or butyl acetate. The substrate was cured at a temperature of 350° C. in an oven to form a non-photosensitive polyimide pixel-defining layer on the substrate.

Figure 2:
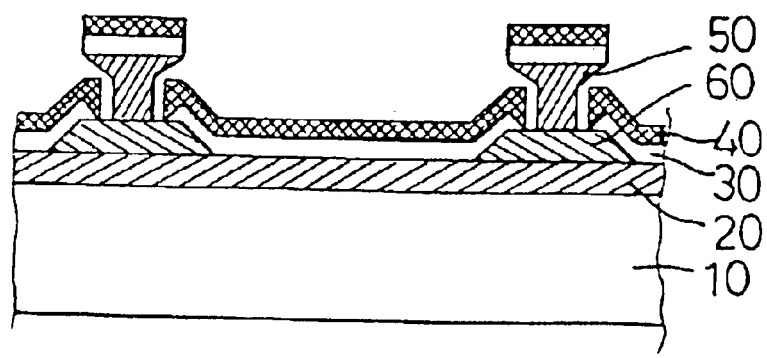
FIG. 2 is a crossection view of the OLED panel of the present invention.

Then a positive chemically amplified photoresist (APEX resist from Shipley corp.) composition was spin-coated on the substrate. The coated substrate was prebaked in ovens at a temperature ranging from 90 to 110° C. A mask with a pattern in stripes was applied as the coated photoresist was exposed to radiation (deep UV). The exposed substrate was post-exposure baked and surfacely treated with TMAH atmosphere at the same time. Ramparts of photoresist are formed in a parallel-stride pattern. The stripes of the ramparts formed are also perpendicular to the stripes of ITO. The ramparts formed on the substrate have a T-shaped cross-section. The width of ramparts stripes is about 0.18 $\mu$m and the height of ramparts is about 0.8 $\mu$m. Then the exposed portions between ramparts are deposited by TPD (N,N'-diphenyl-N,N'-bis(3-methylphenyl)-1,1'-biphenyl-4,4'-diamine) at a 700 Å thickness. Subsequently, $Alq_3$ is deposited on the same area at a 500 Å thickness. MgAg was deposited on the same area at a 1000 Å thickness to form a panel of an OLED (as shown in FIG. 2).

Although the present invention has been explained in relation to its preferred embodiment, it is to be understood that many other possible modifications and variations can be made without departing from the spirit and scope of the invention as hereinafter claimed.

What is claimed is:

1. A method for forming a pixel-defining layer on an OLED panel, comprising following steps:
   (A) providing a substrate;
   (B) forming a plurality of first electrodes in parallel stripes on said substrate;
   (C) coating a layer of non-photosensitive polyimide or polyimide precursor compositions on said substrate with said first electrodes;
   (D) first prebaking said substrate with said layer of said non-photosensitive polyimide or polyimide precursor compositions;
   (E) coating a layer of photoresist compositions on said layer of non-photosensitive polyimide or polyimide precursor compositions;
   (F) second prebaking said substrate with said layer of said photoresist compositions;
   (G) forming patterns of said photoresist by exposing said substrate to masked radiation and developing said photoresist;
   (H) etching said layer of said non-photosensitive polyimide or polyimide precursor compositions to form a patterned layer of said non-photosensitive polyimide or polyimide precursor compositions;
   (I) releasing or stripping said patterned layer of said photoresist compositions; and
   (J) baking said substrate with said patterned non-photosensitive polyimide or polyimide precursor compositions for crosslinking or curing said patterned non-photosensitive polyimide or polyimide precursor compositions to form said pixel-defining layer.

2. The method as claimed in claim 1, further comprising selectively forming parallel photoresist ramparts having T-shape cross-section on said non-photosensitive polyimide pixel-defining layer, and said patterns of said photoresist are parallel stripes.

3. The method as claimed in claim 1, wherein said substrate with patterned non-photosensitive polyimide or polyimide precursor compositions is baked at a temperature which is at least higher than 220° C. for crosslinking or curing said patterned non-photosensitive polyimide or polyimide precursor compositions.

4. The method as claimed in claim 1, wherein said patterns of said pixel-defining layer are parallel stripes and said parallel stripes of pixel-defining layer intersect with said first electrodes perpendicularly.

5. The method as claimed in claim 2, wherein said stripes of said photoresist intersect with said first electrodes perpendicularly.

6. The method as claimed in claim 1, wherein said photoresist is positive photoresist.

7. The method as claimed in claim 1, further comprising (K) forming a plurality of photoresist ramparts on said substrate and selectively on said first electrodes or said stripes of said polyimide pixel-defining layer; wherein said photoresist ramparts are about parallel to the surface of said substrate.

8. The method as claimed in claim 1, wherein further comprising (L) depositing organic electroluminescent media to the exposed area between said ramparts on said substrate or said first electrodes; and (M) forming a plurality of second electrodes on said organic electroluminescent media on said substrate or said first electrodes.

9. The method as claimed in claim 1, wherein said first electrodes are perpendicular to said second electrodes.

10. The method as claimed in claim 1, wherein said first electrodes are transparent.

11. The method as claimed in claim 1, wherein substrate with prebaked layer of said non-photosensitive polyimide or polyimide precursor compositions is cleaned or dried before said layer of photoresist is coated.

12. The method as claimed in claim 1, further comprising selectively forming a plurality of auxiliary electrodes on or beneath the surface of said substrate before forming a plurality of said first electrodes on said substrate.

* * * * *